United States Patent [19]
Proebsting

[11] Patent Number: 5,343,090
[45] Date of Patent: Aug. 30, 1994

[54] SPEED ENHANCEMENT TECHNIQUE FOR CMOS CIRCUITS

[75] Inventor: Robert J. Proebsting, Los Altos, Calif.

[73] Assignee: National Semiconductor Corporation, Santa Clara, Calif.

[21] Appl. No.: 105,768

[22] Filed: Aug. 11, 1993

Related U.S. Application Data

[63] Continuation of Ser. No. 821,890, Jan. 15, 1992, abandoned, which is a continuation of Ser. No. 704,685, May 17, 1991, abandoned, which is a continuation of Ser. No. 586,849, Sep. 24, 1990, abandoned, which is a continuation of Ser. No. 515,769, Apr. 24, 1990, Pat. No. 4,985,643.

[51] Int. Cl.$^5$ ............................................. H03K 17/04
[52] U.S. Cl. ..................................... 307/443; 307/451
[58] Field of Search ................. 307/443, 448, 450–451, 307/481, 279, 290, 542, 296.3, 296.8, 265–267, 572–575, 585, 260, 594, 596, 272.2; 377/77, 79, 116, 122

[56] References Cited

U.S. PATENT DOCUMENTS

| | | | |
|---|---|---|---|
| 3,378,783 | 4/1968 | Gibson | 330/35 |
| 3,603,810 | 9/1971 | Clayson | 307/269 |
| 3,700,916 | 10/1972 | Vittoz | 377/116 X |
| 4,250,406 | 2/1981 | Alaspa | 377/79 X |
| 4,377,757 | 3/1983 | Könemann et al. | 377/77 X |
| 4,476,401 | 10/1984 | Lin | 307/269 |
| 4,490,627 | 12/1984 | Moench et al. | 307/290 |
| 4,490,633 | 12/1984 | Noufer et al. | 307/475 |
| 4,656,373 | 4/1987 | Plus | 307/451 X |
| 4,700,089 | 10/1987 | Fujii et al. | 307/605 |
| 4,703,200 | 10/1987 | Zangara | 307/451 X |
| 4,728,820 | 3/1988 | Lee | 307/443 |
| 4,799,040 | 1/1989 | Yanagi | 377/116 X |
| 4,806,786 | 2/1989 | Valentine | 307/279 |
| 4,820,939 | 4/1989 | Sowell et al. | 307/272.2 X |
| 4,843,254 | 6/1989 | Motegi et al. | 377/79 X |
| 4,985,643 | 1/1991 | Proebsting | 307/443 |

FOREIGN PATENT DOCUMENTS

| | | | |
|---|---|---|---|
| 0176226 | 4/1986 | European Pat. Off. | H03K 3/033 |
| 61-118023 | 6/1986 | Japan | H03K 19/094 |

OTHER PUBLICATIONS

"On-Chip Receiver Circuit Design," *IBM Technical Disclosure Bulletin*, vol. 31, No. 5, Oct. 1988, pp. 258–260.

Deschacht et al., "Explicit Formulation of Delays in CMOS Data Paths," *IEEE J. Solid-State Cir.* (1988) 23:1257–1264.

Markus, "Chained Astables" circuit, *Modern Electronic Circuits Reference Manual*, McGraw-Hill Book Co., 1980, p. 605.

Towler, Fred, et al., "A 128 k 6.5 ns Access/ 5 ns Cycle CMOS ECL Static RAM"; Digest of Technical Papers; 1989 IEEE International Solid-State Circuits Conference; pp. 30–33.

Krambeck, R. H., et al., "High-Speed Compact Circuits with CMOS," IEEE Journal of Solid-State Circuits (Jun. 1982) SC-17(3):614≠619.

Shoji, M., "FET Scaling in Domino CMOS Gates," IEEE Journal of Solid-State Circuits (Oct. 1985) SC-20(5):1067–1071.

(List continued on next page.)

*Primary Examiner*—David R. Hudspeth
*Attorney, Agent, or Firm*—Townsend and Townsend Khourie and Crew

[57] ABSTRACT

A speed enhancement technique for CMOS circuits is disclosed. In the series of logic stages, nodes in the signal path of a pulse are set by preceding logic stages, then reset by feedback from subsequent logic stages. This eliminates the capacitive burden of resetting any given node from the input signal to allow substantially all of the input signal to be employed in setting the nodes to an active state rather than wasting part of the signal in turning off the reset path. The technique is illustrated as applied to RAM circuits.

27 Claims, 7 Drawing Sheets

OTHER PUBLICATIONS

Oklobdzija, V. G., et al., "Design–Performance Trade-Offs in CMOS Domino Logic," IEEE 1985 Custom Integrated Circuits Conference, CH2157-6/85-0000-0334, pp. 334–337.

Pretorius, J. A., "Optimization of Domino CMOS Logic and Its Applications to Standard Cells," IEEE 1984 Custom Integrated Circuits Conference, CH1987-7/84/0000-0150, pp. 150–153.

Pretorius, J. A. et al., "Analysis and Design Optimization of Domino CMOS Logic with Application to Standard Cells," IEEE Journal of Solid–State Circuits (Apr. 1985) SC-20(2):523–530.

Hofman, M., et al., "A Domino CMOS Logic Synthesis System," 1985 International Symposium on Circuits and Systems (Jun. 1985) 2:411–414.

Oklobdzija, V. G., et al., "Design–Performance Trade-Offs in CMOS–Domino Logic," IEEE Journal of Solid–State Circuits (Apr. 1986) SC-21(2):304–306.

Pretorius, J. A., et al., "Charge Redistribution and Noise Margins in Domino CMOS Logic," IEEE Transactions on Circuits and Systems (Aug. 1986) CAS-33(8):786–793.

Oklobdzija, V. G., et al., "On Testability of CMOS–Domino Logic," IEEE 14th International Conference on Fault–Tolerant Computing (1984) 0731-3071/84/0000/0050, pp. 50–55.

Zhang, C., "An Improvement for Domino CMOS Logic," Computer & Electrical Engineering (1987) 13(1):53–59.

Pretorius, J. A., et al., "Latched Domino CMOS Logic," IEEE Journal of Solid–State Circuits (Aug. 1986) SC-21(4):514–522.

Pretorius, J. A., et al., "Latched Domino CMOS Logic," Electronics Letters (Mar. 1985) 21(7):263–264.

Murphy, B. T., et al., "Twin Tubs, Domino Logic, CAD Speed Up 32-bit Processor," Electronics (Oct. 1981) pp. 106–111.

Heller, L. G., "Cascode Voltage Switch Logic: A Different CMOS Logic Family" 1984 IEEE International Solid–State Circuits Conference (Feb. 1984) 0193-6530/84/0000/0016, pp. 16–17.

Adams, R. Dean, et al., "FAM 16.4: An 11 ns 8K×18 CMOS Static RAM," Digest of Technical Papers, 1988 IEEE International Solid–State Circuits Conference, pp. 242–243, 386.

SPEED ENHANCEMENT TECHNIQUE FOR CMOS CIRCUITS

This application is a continuation of Ser. No. 07/821,890, filed Jan. 15, 1992, now abandoned which is a continuation of Ser. No. 07/704,685, filed May 17, 1991, now abandoned which is a continuation of Ser. No. 07/586,849, filed Sep. 24, 1990, now abandoned which is a continuation of Ser. No. 07/515,769, filed Apr. 24, 1990, now U.S. Pat. No. 4,985,643.

BACKGROUND OF THE INVENTION

This invention relates to circuits employing field effect transistors, and in particular to a technique for substantially increasing the speed of operation of circuits employing complementary field effect transistors.

2. Description of the Prior Art

In MOS circuits the speed of operation is limited by resistance and capacitance, the resistance of an MOS transistor driving the capacitance of the next MOS transistor. Because the output current of an MOS transistor is proportional to its channel width, if a narrow transistor is employed to drive a high capacitance load, a very long delay would result. To reduce this delay in digital circuits, a series of cascaded inverters are frequently used. In such circuits the time delay for each stage is proportional to the fan-out of that stage, which is the ratio of the size (channel width) of the driven device or devices to that of the driving device or devices. Thus, the choice of relative sizes of the driving and driven devices affects the speed of the circuit.

Because the speed of any given inverter stage is a constant times the fan-out of that stage, if a specified fan-out is to be driven using a series of inverters, there are many possible choices. For example, consider a total fan-out of 100. If a single inverter with a fan-out of 100 is employed (a 4-micron width stage driving a 400-micron width stage), then the circuit will have a delay of 100 units of time because the delay is a constant times the fan-out. Alternatively, if we are not concerned with the polarity of the output, two serial inverter stages could be employed, each with a fan-out of 10. This provides a total fan-out for the circuit of 10 times 10 or 100, yet this driving arrangement has a delay of only 20 units of time (two delays, each of ten units of time). If four inverters are employed, each will have a fan-out of the square root of 10 and the total circuit delay will be four times the square root of 10, or about 12.65 units of time.

Thus, a circuit designer is presented with a range of choices for the number of stages to drive a given size load. There is an optimum number of stages; however, at which the total delay for the circuit is minimized, and that total delay may not be further reduced using conventional techniques. This minimum delay is reached when the size of each stage is e (the base of natural logarithm-approximately 2.7) times the size of the previous stage. In other words, for maximum speed the total channel width of the devices in any stage is approximately 2.7 times the total channel width of the devices in the preceding stage.

A basic complementary field effect transistor inverter includes a PMOS device connected between a positive supply and an output node and an NMOS device connected between the output node and a negative supply with the gates connected in parallel and to the input. For example, see the inverter between nodes 7 and 8 in FIG. 1. In such an inverter the input signal going high (to the positive supply voltage) turns off the PMOS device to disconnect the common output node from the high potential, and turns on the NMOS device to pull the output node low by connecting it to the negative supply potential, usually zero volts or ground. Because an NMOS device is approximately twice as conductive as a PMOS device for a given gate width and turn-on voltage, by making the NMOS device approximately half the width of the PMOS device, the inverter will have approximately the same delay for both high-to-low or low-to-high logic transitions.

A short channel transistor has both low on resistance and low capacitance which minimizes switching time. The channel length of all transistors is therefore the minimum allowed by the manufacturing technology employed.

In all following discussions, transistor sizes refer to transistor channel width with the understanding that all channel lengths are the minimum allowed by the technology. In a typical inverter chain, a first inverter might include a 10-micron PMOS device and a 5-micron NMOS device. The following inverter (with near optimum fan-out of approximately three) therefore would include a 30-micron PMOS device and 15-micron NMOS device. The third inverter would have a 90-micron PMOS device and a 45-micron NMOS device, etc. In the first inverter the 5-micron NMOS device is driving both a 30-micron PMOS device and 15-micron NMOS device in the second inverter for total of 45 microns, or an NMOS fan-out of 9. Similarly, the 10-micron PMOS device in the first inverter is driving a 30-micron PMOS device and a 15-micron NMOS device in the second inverter for a PMOS fan-out of 4.5. Because the PMOS device is half as conductive as an NMOS device of the same size, the 10-micron PMOS will have a delay equivalent to that of the 5-micron NMOS driving the same load.

In each stage the NMOS device turns on the PMOS device and turns off the NMOS device in the following inverter. Likewise, in each stage, the PMOS device turns on the NMOS device and turns off the PMOS device in the following inverter. Because in each inverter the PMOS device is twice the size of the NMOS device, two-thirds of the charge from the previous NMOS device will go to the PMOS device and one-third will go to the NMOS device. Similarly, the PMOS device in each inverter will send one-third of its charge to the NMOS device in the following inverter and two-thirds to the PMOS device in the following inverter. Thus, charge from each device in a preceding stage is supplied to two devices in a following stage.

One form of CMOS logic in which speed is somewhat enhanced with respect to the inverter chain technique described above is domino logic. See, e.g., R.H. Krambeck, et al., "High-Speed Compact Circuits with CMOS," *IEEE Journal of Solid-State Circuits* (June, 1982) SC-17(3):614–619.

In domino logic circuits, an array of transistors is configured to perform a specified logic function. The output node is precharged to a particular voltage level (typically high for NMOS) while all current paths to the other voltage level (ground for NMOS) are turned off. During this phase the input to each of the gates of all transistors in the circuit are set to the desired level. Next, the current path to the high level is turned off by a clock signal, and the path to ground is turned on. Depending on the states of the input signals, the output node will either float at the high level or be pulled down, thereby evaluating the logic function implemented by the transistor array. The transition from precharge to evaluation is accomplished by a single clock edge applied simultaneously to all gate electrodes in the circuit. FIG. 5 of the above paper shows a typical domino logic circuit.

Domino logic, however, suffers from several disadvantages relative to the present invention. It operates at undesirably low speed because each logic gate drives an inverter consisting of both a PMOS and an NMOS transistor. It has low throughput because the multiple sequential stages receive a common precharge clock signal, and thus one complete clock cycle is required for each logic operation. Additionally, domino logic does not provide logic functions in both NMOS and PMOS. Furthermore, in both the inverter chains and domino logic prior art, the logic functions are performed by changes in voltage levels. Because changes in the levels of output nodes are sensed after the circuit reaches a steady state condition, new input information cannot be applied until the final output of the domino chain in question is stable. This results in delays until the entire circuit stabilizes, even though only a small portion may be changing.

Other prior art is listed in an accompanying disclosure statement.

SUMMARY OF THE INVENTION

I have developed a circuit technique which allows circuits employing complementary field effect transistors to operate substantially more rapidly than the speed achieved by prior art circuits. Broadly, my invention is to employ pulses in CMOS circuits to perform only one of the two tasks performed by the voltage levels in prior art circuits. In circuits employing my invention, pulses are used to set a logic node to an active state, then some other pulse generated downstream in the circuit is used to reset the node to the inactive state in preparation for the next active pulse. My technique allows virtually all of the charge from any given stage in a circuit (whether PMOS or NMOS) to be employed in setting a following stage to the active state, with virtually none wasted in turning off the reset device. This approach minimizes the time delay inherent in operation of the circuit. Additionally, the use of pulses, rather than levels, allows pipelining of circuit operation. Thus, while one part of the circuit is active, a preceding portion may be reset in anticipation of the next pulse, while an even earlier portion may have a second active pulse propagating to the output. Furthermore, this technique permits propagation of a pulse through an arbitrary number of stages with the pulse width remaining essentially unchanged.

In a preferred embodiment, a circuit fabricated according to my invention includes a plurality of cascaded stages, each stage capable of being placed in one of a first logic state or a second logic state. The active logic state of a selected stage is controlled by one or more stages immediately preceding the selected stage, while the inactive logic state is controlled by a stage following the selected stage. In alternate stages of logic, the active state will alternate between the high logic level and the low logic level.

In another embodiment a circuit fabricated according to my invention includes a node, a logic circuit coupled to the node for placing the node in an active logic state at a first time, and a resetting circuit coupled to the node and responsive to the logic states of that node for resetting the node to the inactive state at a second time after the first time in response to the active logic state of the node at the first time.

In still a further embodiment of my invention, the circuit includes a high reference potential, a low reference potential, and a plurality of cascaded stages. Each stage comprises one or more PMOS field effect transistors connected between the positive supply node and an output node and one or more NMOS transistors connected between the output node and the negative supply to form a logic stage. The active logic state of a stage is controlled by the input node(s) of that stage, (the output node(s) of the immediately preceding stage(s)) while the inactive logic state is controlled by the output node of a later stage.

DETAILED DESCRIPTION OF THE PREFERRED EMBODIMENTS

Figure 1:
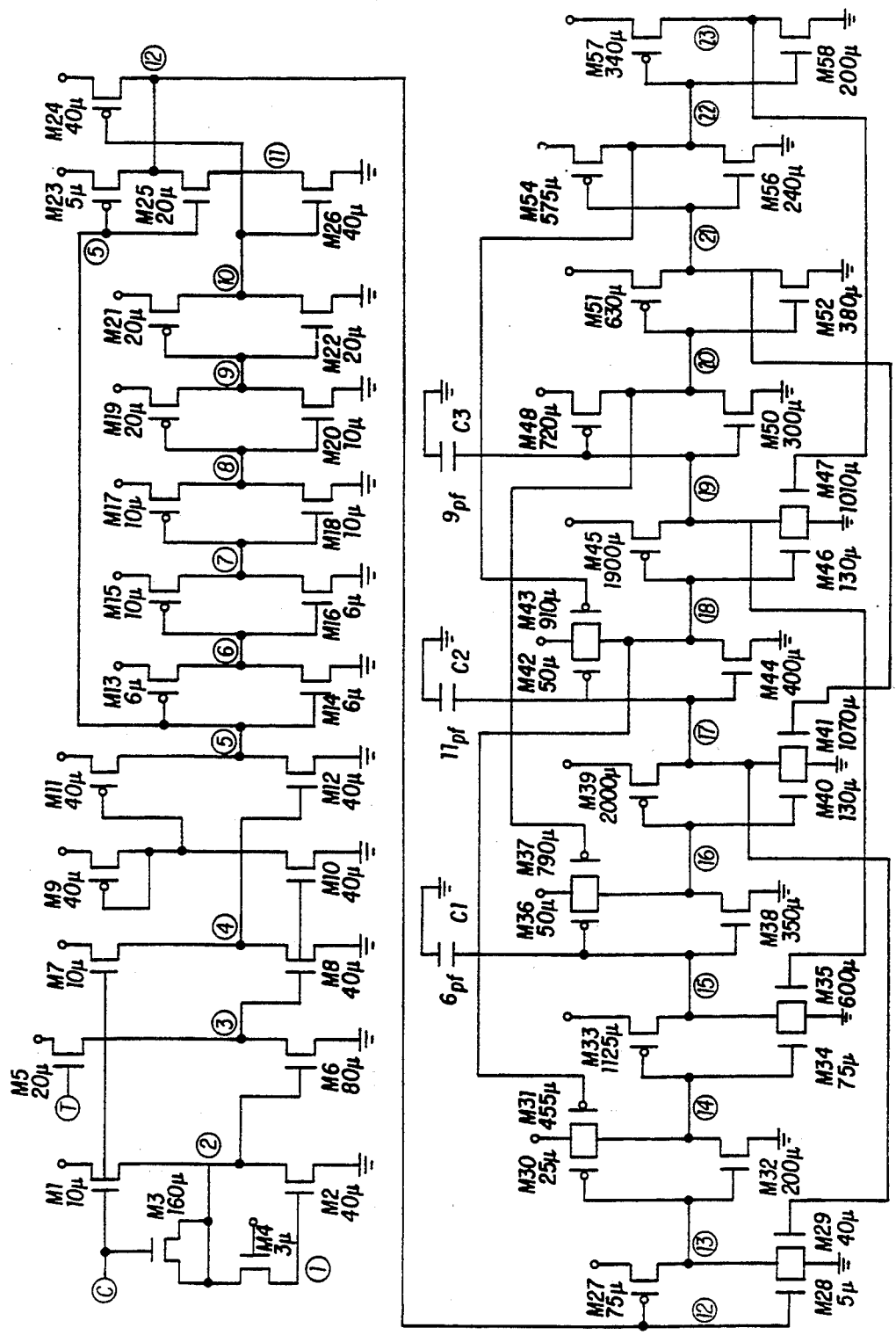
FIG. 1 is a schematic of a clock pulse generator circuit.

FIG. 1 is a circuit schematic of a circuit fabricated according to the preferred technique of my invention. As will be discussed further below, the circuit technique of my invention has numerous applications to many different kinds of circuits. For illustration, the circuit shown in FIG. 1 is a clock pulse generator circuit. This circuit, in response to a differential emitter-coupled logic (ECL) input signal, amplifies the voltage to CMOS voltage levels, converts one edge to a pulse, amplifies that pulse, and then uses the amplified pulse to drive other circuits represented by capacitance loads C1, C2, and C3. The use of ECL is illustrative, and in practice any type of input signal can be used. The circuit shown includes three subcircuits, an emitter-coupled logic interface for amplifying the ECL logic input voltage levels to CMOS voltage levels (upper left portion of FIG. 1), a pulse generator (upper right portion of FIG. 1), and a fan-out circuit (lower portion of FIG. 1) using the new techniques herein described for amplifying the drive capability of the pulses from the pulse generator.

The configuration and operation of the fan-out circuit will be described first, followed by a description of the other portions of the circuit which do not use the new techniques disclosed herein. The small circles on the gates of transistors denote PMOS transistors, while the other transistors are NMOS transistors. The circles shown on the sources or drains of the transistors of this and other figures represent connections to a positive reference potential $V_{cc}$, typically 5 volts.

Although the complementary MOS transistors, designated M27–M58 in the fan-out circuit, are configured into a series of logic stages, the operation of the circuit may be more readily understood by considering each transistor to have one of three different functions—primary signal path devices (set to active state), reset devices (reset to inactive state), and power-up/hold devices (maintain inactive state). The primary devices operate to fan-out and propagate pulses from the input, while the reset devices reset each node to its inactive state in anticipation of the next pulse. The power-up/hold devices function to place all nodes at the proper (inactive) levels when power is first applied to the circuit, and to indefinitely hold all nodes to their inactive states in the absence of active pulses.

If when the circuit powers up any node is in the active state or at an intermediate voltage level, that condition will propagate as an active pulse through the following stages causing a reset to the inactive state of all the original stage and others affected. Thereafter, a small power-up/hold transistor connected to the input or an appropriate voltage will maintain that node inactive until the arrival of the next active pulse.

In some applications where active pulses (followed by reset pulses) are guaranteed to occur without interruption, the power-up/hold devices may be omitted, for example, in clock generators where the clock is never stopped or with word line selection in DRAMs where refresh requirements put a maximum time between active pulses which is short relative to leakage time. In circuits with no guarantee of sufficiently frequent active pulses, such as SRAMs, the power-up/hold device will almost always be employed.

Each of the CMOS logic stages between nodes 12 and 19 includes one device from each of the above categories. For example, transistors M30, M31, and M32 form a CMOS stage which, in response to a high input signal on node 13, supplies a low output signal on node 14. In this stage the primary signal path device is the large NMOS transistor M32 which has its gate connected to node 13, its drain connected to node 14, and its source connected to ground. The large reset PMOS transistor M31 has its source connected to the reference potential ($V_{cc}$), its drain connected to node 14, and its gate connected to an output node of a downstream stage, in this case the stage between nodes 17 and 18. Small PMOS transistor M30 functions as the power-up/hold device, with source and drain connected in parallel to transistor M31 and with its gate connected to the input node 13. All stages in the fan-out circuit driving even numbered nodes 14, 16, 18, 20 are similarly configured. For example, the inverter between nodes 17 and 18 has large NMOS transistor M44 as the set device, large PMOS transistor M43 as the reset device, and small PMOS transistor M42 as the power-up/hold device. Because the chain of stages must end somewhere, stages after the last load C3 (node 19) do not contain separate reset and power-up/hold devices. (There is no later stage to do the reset.) For those stages only a single device (large power-up/hold) is employed to perform both the reset and the power-up/hold functions.

Stages in the fan-out circuit driving odd numbered nodes employ complementary devices to those described above. For example, the stage between nodes 14 and 15 includes a large PMOS transistor M33 in the main signal path, and uses small NMOS transistors M34 and large NMOS transistor M35 to provide the power-up/hold and reset functions, respectively. In this stage the PMOS device M33 has its gate connected to the input node, its source to the positive potential supply, and its drain to the output node, while the NMOS reset device M35 has its gate connected to a downstream stage (node 19), its source to ground, and its drain to the output node. The power-up/hold device M34 has its source and drain connected in parallel to the reset device M35 and its gate to the input node. In some embodiments the power-up/hold transistor gate will be set to a fixed DC reference potential. In this case the width, length and gate voltage are selected to assure that the current through it exceeds any leakage current which might switch the node to the active state. In other embodiments, a high value resistor can be used in place of the power-up/hold device.

A series of capacitors C1, C2 and C3 connected to nodes 15, 17, and 19, respectively, represent loads being driven by the circuit. In an actual application of the fan-out circuit shown in FIG. 1, other circuitry would be connected in place of the capacitors to receive the clock pulse signals from the generator circuit. Each picofarad of capacitance load C1, C2 and C3 is equivalent to driving approximately a 500-micron wide MOS gate. Thus, the 11 picofarad load on node 17 is representative of having that node drive about 5500 microns of gate width in external circuitry, which circuitry is not shown in FIG. 1. Although only three loads are shown, it should be apparent that by extending the fan-out circuit, as many loads may be driven by the circuit as desired. In some dynamic RAM circuits over 20 loads are driven by a clock generator circuit. Also, because the loads shown happen to all be connected to odd numbered nodes, they all have positive-going pulses. If a negative pulse were required, the external circuitry would simply connect to the appropriate even-numbered node.

For illustration, transistor sizes (channel widths) have been shown on FIG. 1. The dimensions provided are hypothetical and are included only to illustrate the relative sizing of transistors throughout the fan-out circuit. The channel length of the devices typically will be the smallest dimension achievable with the particular process used to form the circuit. Each stage depicted has a fan-out greater than one as it is driving a larger total output capacitance than it has input capacitance. As mentioned above, because the PMOS devices are approximately half as conductive as the same width NMOS devices, they have twice the delay for a given fan-out. Thus, to provide a constant delay for each stage in the chain, PMOS devices in the main signal path have a fan-out (3) half the fan-out (6) of the NMOS devices in the main signal path. For example, 75-micron PMOS transistor M27 is driving a combination of 25-micron PMOS transistor M30 and 200-micron NMOS transistor M32 for a total fan-out of 3 ((200+25) / 75=3). 200-micron NMOS transistor M32 has a fan-out of 6 because it drives both 1125-micron PMOS transistor M33 and 75-micron NMOS transistor M34 ((1125+75) / 200=6).

The operation of the circuit shown in the lower portion of FIG. 1 is as follows. Assume that when the circuitry is first turned on, node 12 is held high. The high signal on node 12 will turn off PMOS transistor M27 to disconnect node 13 from the reference potential. Node 12 being high will also turn on NMOS transistor M28 to connect node 13 to ground and pull it low, regardless of whether transistor M29 is on or off. The low level signal thereby established on node 13 will turn off transistor M32 to disconnect node 14 from ground potential, and will turn on PMOS transistor M30 to pull node 14 high, regardless of the state of transistor M31. Eventually, the high signal on node 12 will result in all even-numbered nodes 12–22 being high and all odd-numbered nodes 13–23 being low. These voltages are defined to be the inactive voltages.

Next, assume that a negative pulse is generated by the pulse generator circuit shown in the top half of FIG. 1 and that this pulse is supplied on node 12. Because of the respective sizes of transistors M27 and M28, almost all of the charge in the pulse is placed on the gate of M27 with very little charge wasted in turning off M28 since M28 is very small. With little charge wasted turning off M28, transistor M27 is turned on very quickly. As a result node 13 will be pulled high (active). Note that the gate of NMOS transistor M29, connected to odd-numbered node 17, will be low (inactive) and transistor M29 will be off at this time. This rising edge on node 13 will turn on transistor M32 to pull node 14 to ground (active), since transistors M30 and M31 are off at this time. Node 14 going low (active) will turn on transistor M33 to pull node 15 high (active) which turns on transistor M38 pulling node 16 low (active), etc.

The time delay between any two nodes changing state is a function of the fan-out and the polarity of the device driving the circuit. Assume that the delay of an NMOS transistor driving a gate its own size (fan-out=1) is 1 unit of time. Because delay is proportional to fan-out, an NMOS transistor driving a transistor six times its own width (fan-out=6) will have a delay of 6. A PMOS transistor, however, having only half the conductance for a given width, has twice the delay of an NMOS for the same fan-out. Thus, a PMOS transistor driving a copy of itself (fan-out=1) will have a delay of 2 while a PMOS transistor driving a transistor three times its own width (fan-out=3) will have a delay of 6. For example, because NMOS transistor M32 is 200 microns in width, and is driving 1200 microns of total transistor width, the fan-out and delay for transistor M32 will be 6. In stages in which the main signal path is a PMOS device, for example, between nodes 12 and 13, the fan-out (the sum of the widths of M30 and M32 (225 microns) divided by the width of M27 (75 microns)) will be 3 and the delay 6. Reference to FIG. 1 shows that node 12 is driving a total of 80 microns of transistor width. Two stages of delay later, node 14 is driving a total of 1200 microns of transistor width. Thus, the total fan-out is 200/80 or 15 for the pair of stages, while the total delay for the pair of stages is 6+6=12 units of time.

Contrast this with a prior art string of conventional CMOS inverters. If we keep the NMOS fan-out of 6 and the PMOS fan-out of 3, we will have each inverter stage twice the size of the driving stage. That is, if one stage has a 20-micron NMOS and a 40-micron PMOS, the preceding stage will have a 10-micron NMOS (fan-out=6) and a 20-micron PMOS (fan-out of 3). This old art provides a fan-out of 2 per stage with a delay of 6 units of time per stage. To get a total fan-out of 16, 4 stages are required ($2^4=16$) having a delay of 6 units of time per stage for a total delay of 24 units of time. Thus, the new circuit provides a fan-out of 15 in half the delay required for the old circuit to provide a fan-out of 16.

To reset each node at the inactive level in anticipation of the next pulse, the reset transistors are driven by downstream inverters. For example, transistor M31 is driven by node 18, rather than node 13. This technique places the charge requirements for pulling node 14 high (inactive) to reset it for the next pulse on a downstream inverter having substantially larger transistors, where relatively small transistor M31 adds little percentage increase in capacitance on node 18. This is clear since each pair of stages provides a fan-out of 15 and a reset pulse from the fourth stage later (two pairs of stages) has a total fan-out of 15×15 or 225. If the gate of transistor M31 were connected to node 13 as in prior art; however, it would triple the capacitance on node 13 and triple the delay of node 13.

Thus, a positive edge (pulse) on node 13 causes a negative edge (pulse) on node 14, causing a positive edge (pulse) on node 15, causing a negative edge (pulse) on node 16, causing a positive edge (pulse) on node 17, and causing a negative edge (pulse) on node 18. The negative edge on node 18 occurs at the same time as the negative edge on node 13, that is, when the original positive pulse on node 13 terminates. The negative edge (pulse) on node 18 turns on PMOS transistor M31 to pull node 14 high, terminating the negative (active) pulse on node 14 one inverter delay after the positive pulse on the preceding node 13 terminated. Thus, any selected node is reset by a pulse which passed that selected node earlier, but only after that pulse reaches the much larger downstream inverter which drives the reset transistor coupled back to the selected node. Because the input pulse to a node essentially needs to drive only a single (set) device rather than to also turn off a reset device, the switching speed is essentially doubled.

The signal at any node will be an active pulse terminating five inverter delays later. The circuitry in the top right portion of FIG. 1 provides a negative pulse on node 12 as will be explained later. The negative edge on node 12 causes a positive edge on node 13 causing a negative edge on node 14, etc. The positive edge on node 17 approximately coincides with the termination (positive edge) of the input pulse on node 12 so that PMOS transistor M27 does not interfere with M29 resetting node 13 to its low inactive state.

Thus, the circuit of the invention provides about the same fan-out (15 vs. 16) in half the delay of prior art circuits. This is achieved because in the main signal path each switching device is driving essentially only one device in the following stage. The word "essentially" is used because if power-up/hold devices are employed, a small percentage of the charge will flow to that device, even through almost all of the charge flows to the much larger set device. That is, M32 drives M33 which drives M38 which drives M39 which drives M44, etc. Thus, essentially all of the charge from each transistor in the set path is used to switch the next transistor in the set path, while very little of the charge is used to turn off the reset path (power-up/hold transistors). The inverters between nodes 19 and 20, nodes 20 and 21, nodes 21 and 22, and nodes 22 and 23 only provide drive current to reset nodes in the upstream inverters to which they are connected. Because the string of stages is finite, the stages at the end of the string are not reset by later inverters.

The circuit technique described has the advantage of eliminating the burden of resetting any given node from the input signal and placing that burden on a downstream stage in which the transistors are sufficiently large so that they may readily drive the much smaller upstream device with little speed penalty. Because all stages have similar fan-out, all have similar delays. Therefore, with each stage being reset by a stage four delays downstream from itself, every node is reset one delay before the next node is reset. That is, as any node is reset, it is guaranteed that the preceding node was reset one delay earlier. Thus, no node is reset at an instant when it is still being pulled in the opposite direction by its input node.

It should be evident that the choice of how far "downstream" to select for the origin of the feedback signal is somewhat arbitrary. In the circuit of FIG. 1 a four-inverter delay is employed; however, any even number could be used. I have found that with a two-inverter delay the active pulse barely reaches its logic level before it terminates. A six-inverter delay, however, unnecessarily delays the minimum time before a second set (active) pulse can follow a first set pulse, without the second (active) pulse occurring at a stage before the reset pulse to that stage terminates.

Across the upper portion of FIG. 1, a prior art circuit is depicted which is used to generate negative pulses at node 12 from positive transitions on node 5. In the upper right-hand corner of the figure, transistors M23, M24, M25 and M26 form a two-input NAND gate. Nodes 5 and 10 must each be high to turn on NMOS transistors M25 and M26, and turn off PMOS transistors M23 and M24. This pulls the output node 12 to ground. If either of nodes 5 or 10 is low, then one of PMOS transistors M23 or M24 will be on; one of the NMOS transistors M25 or M26 will be off; and node 12 will be high.

Connected between nodes 5 and 10 are a series of five CMOS inverters each comprising one PMOS and one NMOS transistor. For example, the inverter between nodes 6 and 7 includes a PMOS transistor M15 and an NMOS transistor M16. With an odd number of inverters between nodes 5 and 10, on a DC basis, nodes 5 and 10 will be out of phase with each other. If node 5 is low, node 6 is high, node 7 low, node 8 high, node 9 low, and thus node 10 is high. Since node 5 is low, node 12 is high. When node 5 next transitions to a high level, for a short time both nodes 5 and 10 will be high, thereby pulling node 12 low. Node 12 will remain low until the high level on node 5 propagates through the chain of inverters, making node 6 low, node 7 high, node 8 low, node 9 high, and node 10 low, thereby pulling node 12 high again. Thus, the positive transition on node 5 causes a negative pulse on node 12. Node 12 will remain high until the next positive transition on node 5. (When node 5 switches low, PMOS transistor M23 is on while NMOS M25 is off, so node 12 remains high.) For any steady state, high or low, on node 5, the steady state of node 12 is high. Only when node 5 transitions high is a negative pulse supplied from node 12. The number of inverters between nodes 5 and 10 and the fan-out of each inverter is chosen such that the pulse width on node 12 is approximately equal (or a little shorter) than the feedback pulse timing. That is, when node 5 goes high, the following two sequences of events simultaneously occur: (1) node 6 goes low, node 7 high, node 8 low, node 9 high, node 10 low, and node 12 high; and (2) node 12 goes low, node 13 high, node 14 low, node 15 high, node 16 low, and node 17 high. With both paths having the same number of delays, the timing is easily adjusted such that node 12 goes high about the same time or slightly earlier than node 17 goes high, node 17 terminating the positive (active) pulse on node 13 only after transistor M27 is turned off.

The circuit shown to the left of node 5 is an ECL interface circuit. Whenever the true T and complementary C input ECL level signals change phase, node 5 will change state (CMOS voltage levels). For example, if node C goes low and node T goes high, node 5 will be pulled high. Node 5 will be pulled low when nodes T and C next change back.

Figure 2:
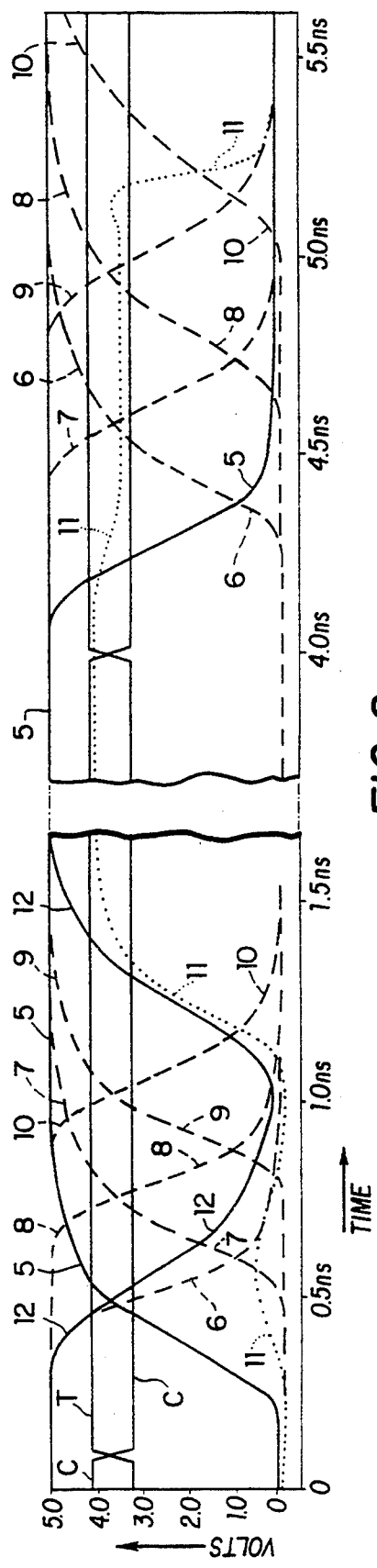
FIG. 2 is a timing diagram for the upper portion of the circuit of FIG. 1.

FIG. 2 is a timing diagram which illustrates the operation of the circuit in the upper portion of FIG. 1. The vertical axis of FIG. 2 represents voltage while the horizontal axis represents time, with intervals of 0.5 nanoseconds marked on the figure. Nodes C and T are switched by well known external ECL circuitry (not shown) whose positive supply is connected to 5 volts and whose negative supply is connected to 0 volts. At time 0 node C is at 4,125 volts and node T at 3.250 volts. At 100 picoseconds, node T goes high and node C goes low. This switching is assumed to be extremely fast, with only about 20 picoseconds required to change the state of the two nodes. The nodes will need to remain in this new condition, with node T high and node C low for a minimum of 1 nanosecond to obtain the correct negative pulse width from node 12. Arbitrarily, at 4 nanoseconds they are switched back to their original level. Thus, in FIG. 2 node C is shown initially as high and switching to low at 100 picoseconds, then remaining low until 4 nanoseconds at which time it is switched back to high. Node T is switched opposite node C. The switching of the true T and complement C input signals at 100 picoseconds propagates through nodes 2, 3 and 4 to cause node 5 to go high between about 300 and 600 picoseconds. Node 5 rising causes node 12 to go low, starting a negative pulse. Node 5 rising also causes node 6 to fall, causing node 7 to rise, node 8 to fall, node 9 to rise, and node 10 to fall as shown in the first half of FIG. 2. Node 10 falling causes node 12 to go high, terminating the negative pulse on node 12. After approximately 4 nanoseconds, the true and complement signals change state, causing node 5 to fall as shown in the second portion of FIG. 2, but having no effect on node 12, since a low voltage on node 5 maintains a high output on node 12. Node 5 falling causes node 6 to rise, node 7 to fall, node 8 to rise, node 9 to fall, and node 10 to rise. Thus, by the end of the time period shown in FIG. 2, node 12 is high and node 5 is low, and all nodes are back to their original voltages. Only when node 5 transitions high is a negative pulse at node 12 generated. When node 5 returns to low, nothing happens at node 12.

Figure 3:
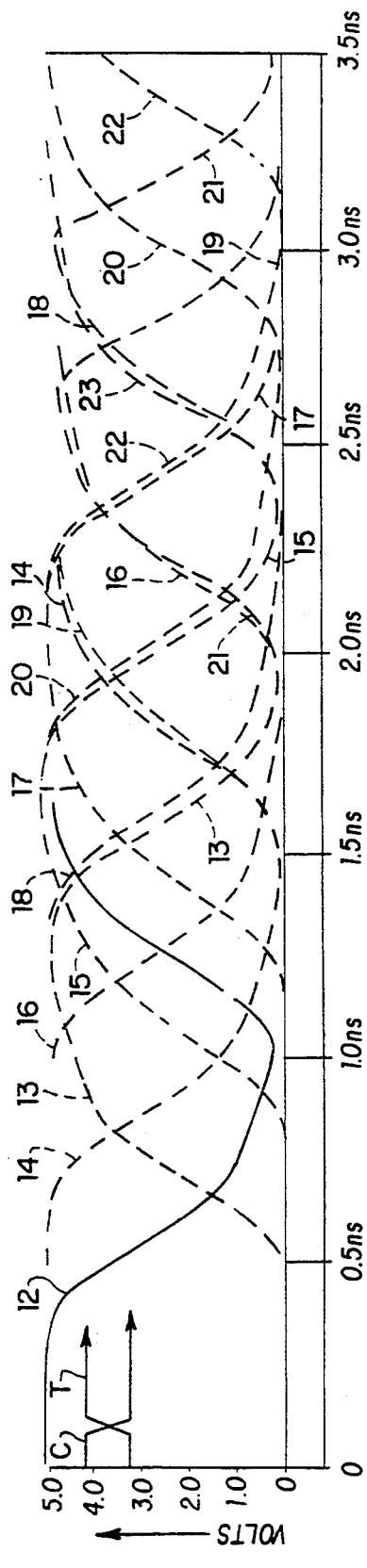
FIG. 3 is a timing diagram for the lower portion of the circuit of FIG. 1.

FIG. 3 illustrates the effect of the negative pulse at node 12 on the circuitry shown in the lower portion of FIG. 1. As node 12 goes low, it drives PMOS transistor M27 to pull node 13 high. The low pulse on line 12 also turns off a very small NMOS transistor M28. Because of the respective sizes of the transistors, nearly all of the charge from node 12 flows into the gate of M27 to pull node 13 high. As node 13 goes high in the period between 0.5 and 1 nanosecond, most of the charge flows into NMOS transistor M32 to pull node 14 low about 0.2 nanoseconds later. As shown by FIG. 3, node 14 going low pulls node 15 high quickly, which in turn pulls node 16 low quickly, and node 17 high in the same manner. The low impedance signal at node 17 has minimal difficulty, compared to the high impedance signal at node 12, driving the relatively small NMOS transistor M29 to then reset node 13 low (inactive). Tiny transistor M28 slightly helps reset node 13, since node 12 goes high slightly before node 17 goes high. As shown by FIG. 3, node 13, which started high at 0.5 nanoseconds, is almost back to 0 volts at 1.8 nanoseconds. Thus, the negative pulse on even-numbered node 12 causes a positive pulse on odd-numbered node 13. The negative pulse on any even-numbered node from 12 to 22 causes a positive pulse on the following odd-numbered node which in turn causes a negative pulse in the next even-numbered node. Thus, a pulse propagates, first negative on one node, then positive on the next node, then negative on the following node, etc. After an active pulse occurs, it is terminated by a reset pulse which is actually the active pulse of a downstream inverter. After the reset pulse terminates, the node is ready to accept a new active pulse, ten inverter delays after the start of the preceding active pulse.

In the course of switching a CMOS inverter from one state to the other state, when the input is halfway between the two supplies, both transistors are momentarily on resulting in DC power consumption across that inverter. It is desirable to have the PMOS transistor turn off before the NMOS transistor turns on, if the output node is being pulled down, or to have the NMOS transistor turn off earlier than the PMOS transistor turns on, when the output node is being pulled high. This effect is totally achieved on the leading edge of the active pulse, since the reset transistor is off when the active pulse occurs, saving substantial power. This effect can also be partially achieved on the trailing edge of the active pulse (when the reset pulse terminates the active pulse) by adjusting the signal timing. One example of the latter is shown in FIG. 3 in the time period between 1.5 nanoseconds and 2 nanoseconds, where node 13 goes low (turning off NMOS M32) slightly ahead of node 18, which is turning on transistor PMOS M31 to pull node 14 high. Similarly, node 15 goes low to turn off transistor NMOS M38 slightly before node 20 goes low, turning on PMOS transistor M37. As another example, in the time period between 2.0 and 2.5 nanoseconds, node 16 goes high slightly before node 21, turning off PMOS transistor M39 slightly before NMOS transistor M41 is turned on. Although both are still momentarily on at the same time, the amount of overlap is reduced.

This adjustment in signal timing is achieved by appropriate sizing of the transistors. While above it was described that in the forward direction the NMOS device drives a fan-out of 6 and the PMOS drives a fan-out of 3, in the feedback direction slightly different loads are employed. For example, node 16 is pulled low by a 350 micron NMOS device, but instead of having a PMOS device twice that size, a slightly larger PMOS transistor M37 is employed. Transistor M37 is 790 microns wide, representing a 20% increase in size over the 2:1 rule for the forward direction. This transistor sizing makes node 16 go high slightly more rapidly than it goes low. Thus, node 16 turns transistor M39 off relatively faster than transistor M41 is turned on, reducing undesirable power consumption.

The circuitry described thus far involves decreasing the delay through a string of inverters rather than through a string of more complex logic gates. But the inventive concept of propagating a pulse rather than a logic level, and of terminating the pulse by a pulse generated downstream, applies equally well to a string of logic gates as to simple inverters.

Figure 4:
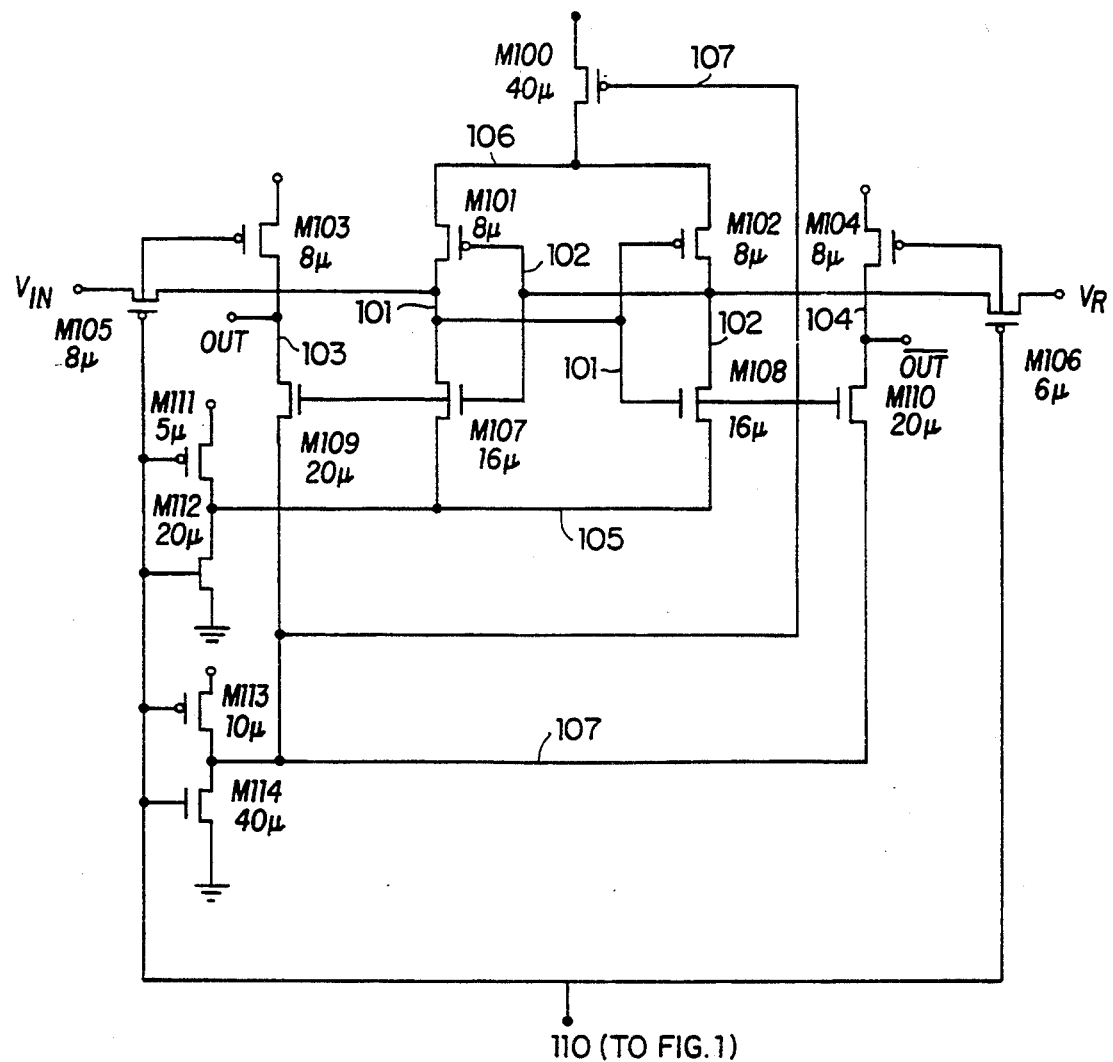
FIG. 4 is a schematic of an input buffer.

FIG. 4 is a circuit schematic of a CMOS input buffer that generates CMOS level pulses necessary for this new logic from an ECL input voltage. The input buffer, typically employed in a random access memory, compares an ECL level input voltage at node VIN with a reference voltage level, representing the middle of the ECL range, applied to node VR. In response to these signals, the circuit, as rapidly as possible, generates a negative-going pulse on one of two output nodes dependent upon the relative voltages of the signals VIN and VR. The circuit supplies the pulse or no pulse as a true output, and no pulse or a pulse as a complementary output. The pulse nature of the outputs is required by the circuitry to follow. This circuit resets nodes from the active state back to the inactive state at the termination of the input pulse on node 110.

Node 110, in the lower portion of the figure, is connected to receive positive pulses from another subcircuit, such as the clock pulse generator shown in FIG. 1. For example, node 110 could be connected directly to node 15 in FIG. 1, and in fact a number of input buffers together represent the 6 picofarad load C1. While node 110 is low (inactive), PMOS devices M105 and M106 are conductive, thereby connecting input voltage VIN to node 101 and reference voltage VR to node 102. Transistor M111 is conductive and transistor M112 nonconductive so that node 105 is high. Transistor M113 is conductive and transistor 114 nonconductive thereby also holding node 107 high.

At the time node 110 goes high, in response to the rising edge of an active pulse propagating through the circuitry of FIG. 1, transistors M105 and M106 are turned off. Additionally, transistor M111 is turned off, and transistor M112 turned on to pull node 105 to ground. Similarly, transistor M113 is turned off, and transistor M114 turned on to pull node 107 to ground. Because node 107 is driving a considerably larger load capacitance in PMOS transistor M100 than is node 105, node 107 will come to ground slightly slower than node 105.

Transistors M107 and M108 are cross-coupled, with the drain of M108, node 102, coupled to the gate of M107, and the drain of M107, node 101, coupled to the gate of M108. Assume that node VIN is low compared to the reference voltage VR. Therefore, node 101 will be lower than node 102 and the (matched) capacitance on nodes 101 and 102 will temporarily maintain these relative voltages even after transistors M105 and M106 turn off. Because node 101 is lower than node 102, as node 105 is pulled to ground, transistor M107 will begin conducting earlier than transistor M108 (the gate of transistor M107 is coupled to the higher potential of node 102 compared to the gate of transistor M108 which is connected to the lower potential of node 101). It is assumed that the threshold voltages and other characteristics of transistors M107 and M108 are well matched. Thus, transistor M107 will pull node 101 down faster than equal-sized transistor M108 will pull node 102 down. As node 101 is pulled down, it will turn on PMOS transistor M102, since node 106 is pulled up by PMOS transistor M100 at this time. So as node 105 goes low, transistor 107 pulls node 101 low, and as node 101 goes low (with node 106 going high), transistor M102 pulls node 102 high. Therefore, there is the same regenerative cross-coupling in PMOS transistors M101 and M102 as in NMOS transistors M107 and M108. Thus, once node 105 is at ground and node 106 is at the positive supply reference potential, the circuit is configured as two cross-coupled inverters, one inverter comprising transistors M101 and M107, and the other inverter comprising transistors M102 and M108. Given an impetus by the potential applied to the node VIN being higher or lower than VR, the inverters will switch one way or the other.

Figure 5:
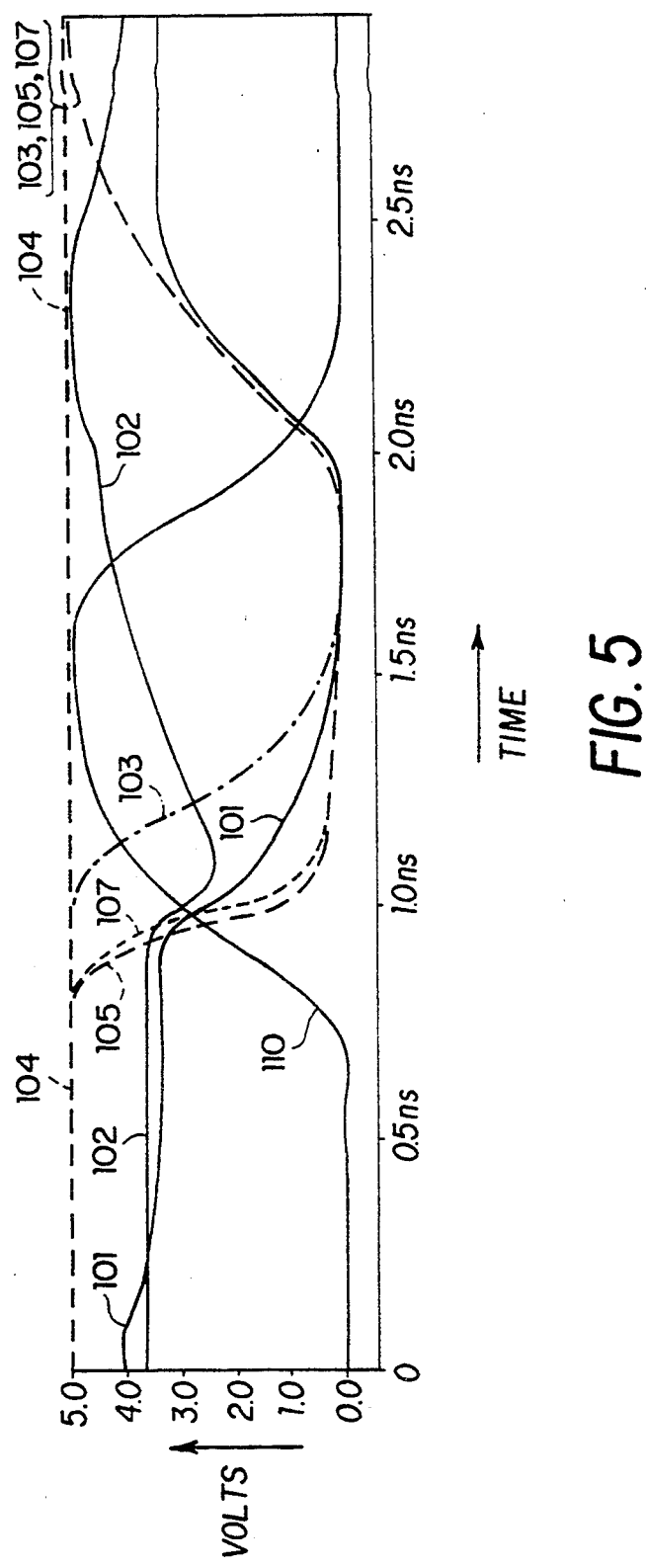
FIG. 5 is a timing diagram for the input buffer circuit.

FIG. 5 is a timing diagram illustrating the switching action just described. As node 105 falls (ahead of node 107), both nodes 101 and 102 begin falling, but their voltage levels separate due to the greater current through transistor M107 than that through transistor M108. This occurs for the period between 0.9 and 1.1 nanoseconds. Beginning at about 1.1 nanoseconds, however, node 102 begins rising due to the current through transistor M102 until by 2 nanoseconds the nodes are nearly 5 volts apart. This has occurred in response to node 110 going high, beginning at approximately 0.7 nanoseconds, and in response to VIN being at a lower voltage than the reference voltage VR.

The delay between nodes 105 and 107 is due to the extra capacitance on node 107 caused by transistor M100. Node 102 is pulled low for a short period when node 105 falls more than one threshold voltage below node 101, thereby causing some conduction through transistor M108. Node 107, however, being slightly delayed with respect to node 105, never gets appreciably more than one threshold voltage below node 101. Therefore, there is very little, if any, conduction through transistor M110, and complementary output node 104 is not appreciably discharged. Node 102, on the other hand, goes up to the positive supply while node 107 goes low, turning on transistor M109 discharging true output node 103. Thus, there is a negative output (active pulse) on true output node 103 while the complementary output node 104 remains inactive at the positive supply reference voltage. If, instead, a high input voltage was on VIN, the negative active pulse would occur at complementary output node 104 while true output node 103 remains inactive at the positive supply reference voltage.

Node 110 is supplied with a positive pulse. Once the pulse passes and node 110 returns negative, the transistor M103 will be turned on, pulling node 103 back to its inactive reference potential, as shown at the ultimate right-hand side of FIG. 5. All other nodes are also reset to their inactive state, since nodes 105 and 107 go positive while nodes 100 and 102 reset to $V_{IN}$ and $V_R$, respectively. Thus, a negative active pulse has been created on node 103 and no pulse created on node 104. This pulse will be later used in a decoder circuit described in conjunction with FIG. 6 below.

Figure 6:
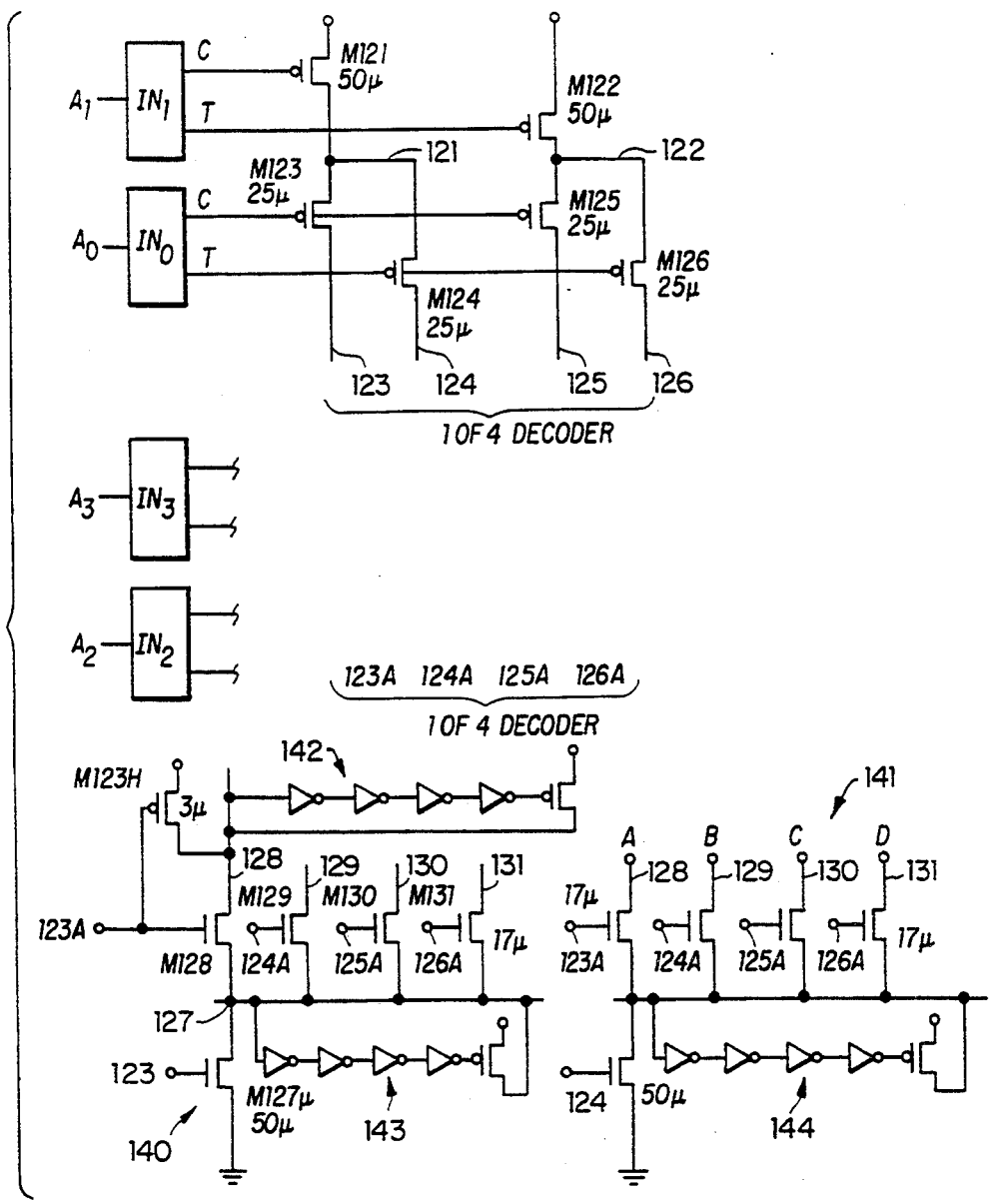
FIG. 6 is a schematic of a 1-of-16 decoder.

FIG. 6 is a circuit schematic of a decoder circuit which employs input buffers such as described above. As shown in FIG. 6 a pair of input buffers $IN_0$ and $IN_1$ each supply true T and complementary C negative active pulse output signals such as those provided by nodes 103 and 104, respectively, of the circuit of FIG. 4. A negative pulse occurs on one but not both nodes T and C. In a typical memory circuit, input buffer $IN_0$ responds to a first address $A_0$, while input buffer $IN_1$ responds simultaneously to a second address $A_1$. The true output of input buffer $IN_1$ is coupled to the gate of PMOS transistor M122, while the true output of input buffer $IN_0$ is coupled to the gates of PMOS transistors M124 and M126. The complementary output of input buffer $IN_1$ controls the gate of PMOS transistor M121, while the complementary output of input buffer $IN_0$ controls the gates of PMOS transistors M123 and M125. Almost all of the output charge (current) from each input buffer is employed in driving the PMOS devices (little wasted in turning off a small NMOS power-up/hold transistor, not shown). This contrasts with prior art devices in which the input buffer drove a complementary pair, resulting in much slower operation.

The source of transistor M121 is connected to the positive supply reference potential, while the drain is coupled to the sources of both transistors M123 and M124. Similarly, the source of transistor M122 is coupled to the reference potential while the drain is coupled to the sources of both transistors and M125 and M126. Because transistors M121 and M122 are each 50 microns in width, while transistors M123–M126 are each 25 microns in width, the total capacitive loading on input buffer $IN_0$ will be about the same as the loading on input buffer $IN_1$.

If input buffer $IN_1$ pulls output C low (active), PMOS transistor M121 pulls node 121 high. Because the true output T then remains high (inactive), transistor M122 remains off. Also, assume that simultaneously (all buffers have a common activating signal) the complementary output of input buffer $IN_0$ is pulled I low, while the true output remains high. Thus, PMOS transistors M123 and M125 conduct, while transistors M124 and M126 remain off. Thus, only output node 123 is pulled high (active) by transistors M121 and M123, while each of nodes 124, 125 and 126 remains low (inactive). Nodes 124 and 126 remain low because transistors M124 and M126 are off, while node 125 remains low because, even though transistor M125 is conducting, transistor M122 is not. Thus, for any address input, one of the four nodes 123–126 will be pulled high (active), while the other three remain at ground (inactive). Because of the sizing of the transistors, the selected node is pulled high through a transistor having a width equivalent to ⅔ of 25 microns (a 50-micron transistor in series with a 25-micron transistor).

Each of the nodes 121 through 126 will be the input of a series of four cascaded inverters not shown in the schematic. The final output of each inverter string is connected to the gate of an NMOS transistor which resets its originating node, 121 through 126, to ground. This resetting action is described in detail below for the third stages of decoding. Also, each node has a small NMOS power-up/hold transistor to maintain all nodes in their inactive state in the absence of active pulses. These transistors are identical in function to those previously described and shown in the bottom half of FIG. 1. The power-up/hold transistors are not shown here to emphasize the primary signal path.

Each of nodes 123–126, as well as four similar nodes 123A, 124A, 125A, and 126A from decoders connected to input buffers $IN_2$ and $IN_3$, is connected to a second stage decoder 140, half of which is shown at the bottom of FIG. 6. For example, node 123 is connected to drive the gate of NMOS transistor M127 which is connected between a node 127 and ground. Four more NMOS transistors M128–M131 are connected between node 127 and corresponding nodes 128–131 to generate four outputs in this 1-of-16 decoder. Assume addresses $A_0$ and $A_1$ pulled node 123 high (active), turning on transistor M127. Depending upon the address supplied to input buffers $IN_2$ and $IN_3$, one of the nodes 123A through 126A will be driven high (active). Therefore, one of transistors M128–M131 will be turned on, thereby pulling one of nodes 128–131 to ground (active). All of the remaining nodes 128–131 will remain high (inactive). Note that the input buffers have active low pulse outputs, while the next stage of logic, the 1-of-4 decoder, has active high pulse outputs. The following logic stage, the 1-of-16 decoder again has active low output pulses. Throughout the circuit, the active state alternates from high to low as the signal progresses from an input stage toward an output stage.

Additional second stages 141 of decoders are connected to nodes 124, 125 and 126 from the first stage, and are connected in a similar manner to the second stage with nodes 123A through 126A, with the result that the four address signals $A_0$–$A_3$ to the input buffers will select 1 of 16 nodes to pull to ground (active). (The inverter chains 142, 143 and 144 in FIG. 6 are discussed below.) A small PMOS power-up/hold device M123H maintains node 128 high (inactive) in the absence of an active (high) input pulse on node 123A. All nodes have similar power-up/hold transistors to maintain the inactive state in the absence of an active pulse. Again, these transistors are generally omitted from the schematic to emphasize the primary signal path.

Figure 7:
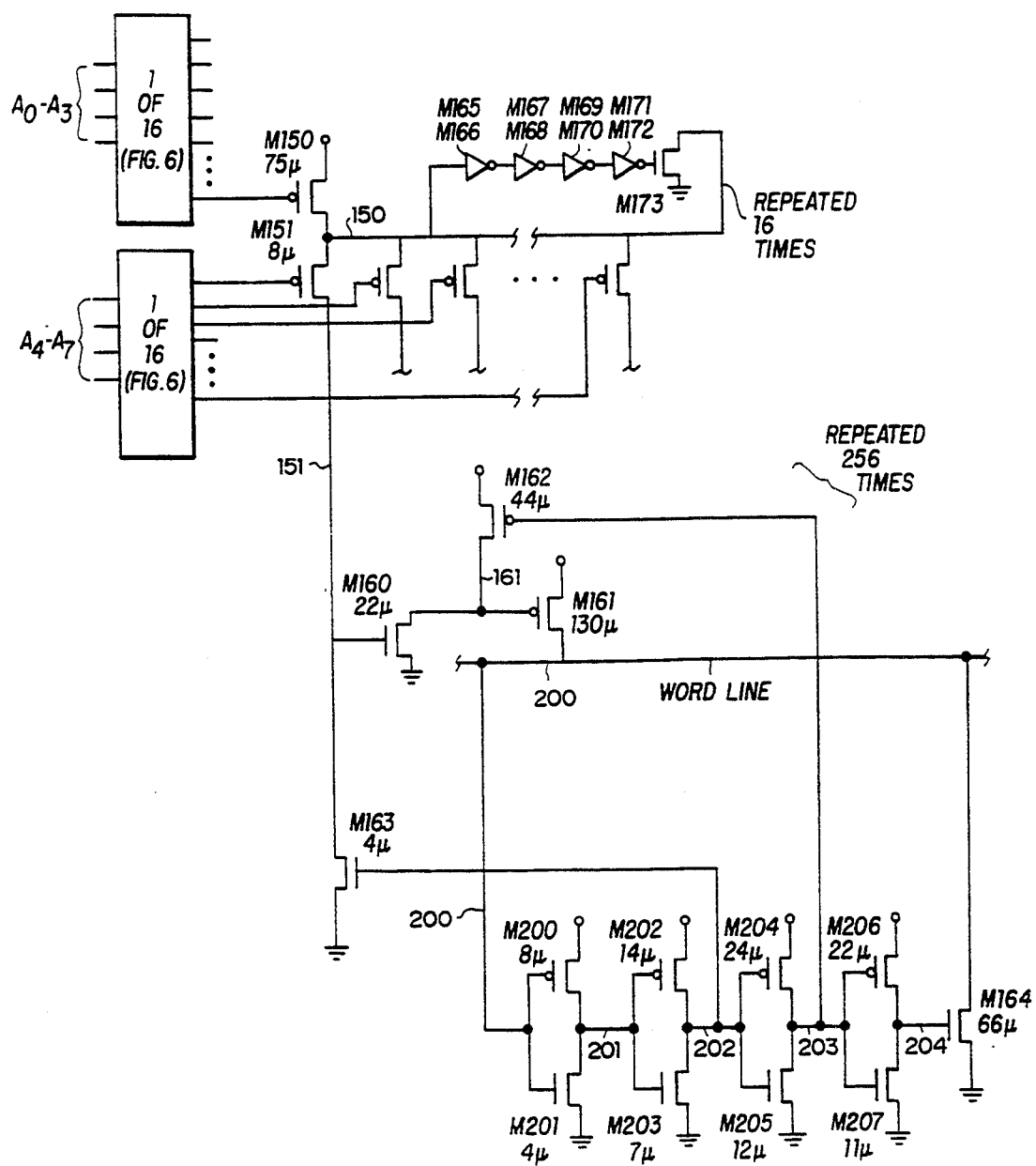
FIG. 7 is a schematic of a word line decoder and reset circuit.

FIG. 7 illustrates how one 1-of-16 decoder may be combined with another 1-of-16 decoder to provide a 1-of-256 decoder, for example, to pull an addressed memory array word line high to read one or more memory cells connected to that word line. In FIG. 6 the output (node 128 for example) being pulled low (active) is pulled low through an equivalent of a 12.5 micron transistor. Because an NMOS device can drive a device six times its width, PMOS transistor M150 in FIG. 7 is 75 microns wide. For the address decoder coupled to address bits $A_4$–$A_7$, however, each output line drives 16 transistors, and accordingly, transistor M151 is 8 microns wide. The loading of 16 PMOS transistors each 8 microns wide would appear to be that of a 128-micron transistor. When only one transistor at a time has its source at the positive supply and therefore has a channel formed, only that one has its full channel capacitance. The other 15 transistors with their sources negative have no channel formed and have reduced capacitance. The 16 transistors together represent approximately equivalent loading of a single transistor about 75 microns wide having a channel formed. Thus, both 1-of-16 decoders have similar capacitive loading. Node 151, if selected, will be pulled up (high active pulse) through an equivalent of about a 7 micron transistor. Because any PMOS transistor drives an NMOS transistor approximately three times its width, the NMOS transistor M160 is about 22 microns wide.

For this example, the capacitive loading of a word line is assumed to be about that of the gate of a 400-micron wide transistor. Thus, a positive active pulse on 22-micron NMOS transistor M160 is used to drive a negative active pulse on 130-micron wide PMOS transistor M161, which in turn pulls the equivalent 400-micron wide word line high (active pulse). Therefore, if all of the nodes were at the proper (inactive) level to begin, and the appropriate address is selected, node 123 (see FIG. 6) is pulled high (active), node 128 is pulled low (active) one delay later, to pull node 151 (FIG. 7) high (active) yet one delay later to turn on transistor M160 pulling node 161 low (active) yet one delay later and finally, in turn, pulling the word line high (active) through transistor M161 still one delay later.

Once the word line goes high, it must remain high long enough to read or write the memory cell but it must then be reset in anticipation for a new memory cycle. The word line as well as nodes 151 and 161 are reset by employing four inverters for each word line comprising transistors M200–M207. When the word line goes high (active), it causes node 201 to go low (active) one delay later, node 202 to go high (active) two delays later, node 203 to go low (active) three delays later, and node 204 to go high (active) four delays later. When node 202 goes high (active) it turns on transistor M163, thereby resetting node 151 low (inactive). Note that a similar feedback path will reset (turn off) the gates of transistors M150 and M151 one delay before node 151 is reset. As node 151 is reset low (inactive), node 203 also goes low (active) both resulting from node 202 going high (active). Node 203 going low (active) resets node 161 high (inactive) one delay after node 151 was reset low (inactive), turning off M160. Coincident with node 161 resetting high and turning off M161 (from 203 going low), node 204 goes high (active) turning on M164 to reset the word line low (inactive). Thus, every node has an active pulse five delays wide terminated by a reset pulse five delays wide which is actually the active pulse on a downstream node, four delays later. In all cases the reset pulse to a node starts about the same time the input pulse to the node terminates. When the reset pulse terminates, the node is ready to accept a new active pulse. The resetting function imposes a negligible load on the nodes being reset. For example, pulling the word line high without any resetting capability involves pulling the equivalent of a 400-micron transistor high. The provision of the reset capability by the inverter chain M200–M207 involves an additional load of only 12 microns on the word line while providing the reset functions for node 151, node 161 and the word line.

Importantly, in contrast to the prior art dynamic circuits (using precharge techniques), only nodes which have changed state are reset. Thus, the 255 word lines which were not pulled up, and which therefore do not require resetting, are not reset, while only the single word line which changed state is reset. This saves considerable dynamic power since only one large transistor M164 has its high capacitance gate driven high to reset the word line. All inactive word lines stay at ground so there is no need to turn on their large transistors M164. Again, not shown are small power-up/hold transistors to maintain all nodes inactive in the absence of an active pulse, and whose gate voltages do not change in the absence of active pulses.

In a similar circuit transistors M165–M172 of FIG. 7 form a four-inverter delay chain which accepts as an input the positive (active) transition of node 150, and in response, four delays later, turns on transistor M173 to pull node 150 back to the inactive state (ground) in anticipation of a new memory cycle. The reset capability burdens node 150 with only a small additional load. (The transistors in each inverter are half the size of those in the following inverter).

The same resetting technique described above is also applied to the decoder circuit shown in FIG. 6. For example, a chain of four inverters 143 and an additional PMOS transistor is used to reset node 127 inactive (high). A similar sequence of inverters 142 resets node 128 inactive (high), while inverters 144 reset the node to which they are connected. Virtually all nodes throughout the circuit have the same algorithm for resetting: when a node is driven active (positive or negative), it causes its own reset (negative or positive) some fixed number of delays later. The reset pulse of one node is the active pulse of a later node. Also, each node may have a power-up/hold transistor to maintain the inactive state in the absence of an active pulse. For any node this transistor is always the same polarity as the reset transistor and has its gate connected either to the gate of the set (to active state) transistor, or to a reference voltage such that the power-up/hold transistor is always conducting a small amount.

Figure 8:
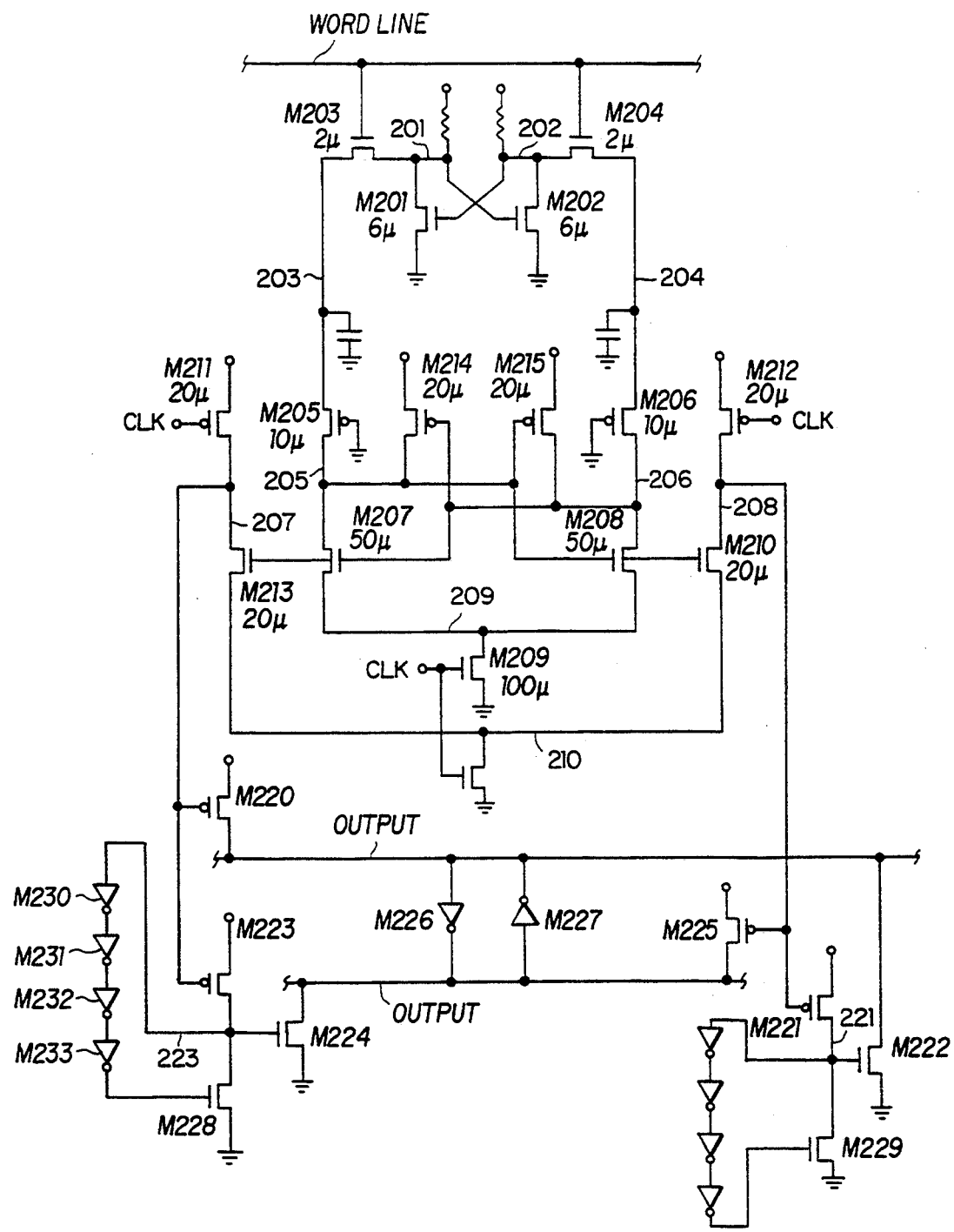
FIG. 8 is a schematic of a sense amplifier.

FIG. 8 is a schematic diagram of a memory cell and sense amplifier for use in conjunction with the circuits of FIGS. 1, 4, 6 and 7. The sense amplifier senses a differential signal from a pair of bit lines 203 and 204. This differential signal is induced by addressing a memory cell coupled between the bit lines. The memory cell may be static or a dynamic memory cell. A well-known static memory cell comprises cross-coupled transistors M201 and M202 connected to the bit lines through transistors M203 and M204. When the word line is turned on (positive active pulse from the decoder described above in conjunction with FIGS. 6 and 7), NMOS transistors M203 and M204 conduct. A bit of data stored in the cell causes either node 201 or 202 to be at 0 volts, while the other is held high by a load resistor coupled to the reference positive supply potential.

Reading of the cell is as follows. Assume that node 201 was at 0 volts. (Transistor M202 is off and M201 is on.) When transistors M203 and M204 are turned on, node 203 will begin discharging toward 0 volts, while node 204 does not discharge because node 202 is at the same high potential as node 204. Because the PMOS devices M205 and M206 are turned on (gate tied to ground), they conduct the voltage on node 203 to node 205 and the voltage on node 204 to node 206.

Transistors M205 and M206 isolate the high capacitance bit lines (nodes 203 and 204) from the sense amplifier. NMOS transistors M207 and M208 are cross-coupled as are PMOS transistors M214 and M215. This circuit operates in the same manner as the input buffer described above. In other words, as the input clock signal CLK from FIG. 1 goes high (a later signal than that used for the address input buffers and about two delays after the selected word line goes active (high)), node 209 is pulled to ground. Because node 205 is at a lower voltage than node 206 (about 100 millivolts lower), as node 209 is pulled down transistor M207 will conduct slightly more than transistor M208, thereby pulling node 205 down faster than node 206. As node 205 falls further, PMOS transistor M215 is turned on, pulling node 206 back to the positive supply voltage. As a result node 205 is pulled to ground as node 206 is pulled positive, as more clearly shown in FIG. 9.

Figure 9:
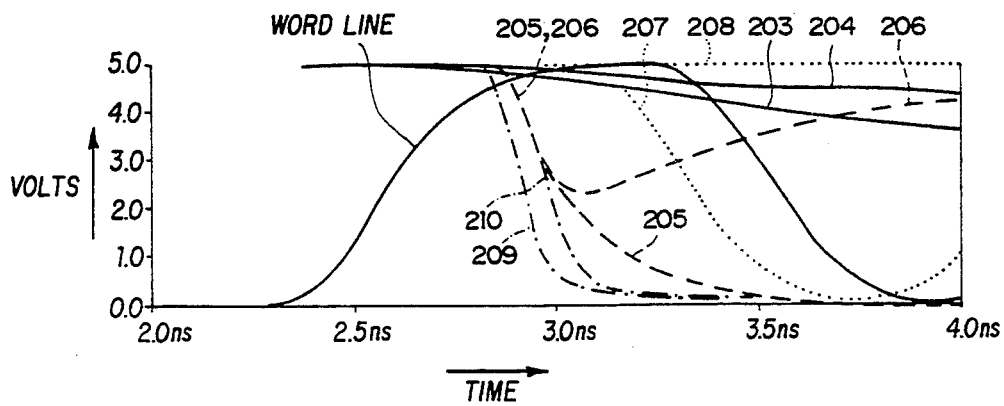
FIG. 9 is a timing diagram for the sense amplifier.

In the same manner as described in conjunction with the input buffer, node 209 will fall faster than node 210, as is also shown in FIG. 9. Node 210 never gets substantially more than one threshold voltage below node 205 so transistor M210 remains essentially off. As a result node 208 remains high (inactive) this cycle. But node 206, returning to the positive supply voltage, exceeds the threshold of M213 as node 210 goes to ground so node 207 is driven to ground (active).

The negative (active) pulse from node 207 is employed by the output shown in the bottom portion of FIG. 8. The negative-going pulse on node 207 turns on transistor M220 to pull the output to the high reference potential, overpowering small inverter M227. PMOS transistor M223 is also turned on, driving node 223 positive and turning on NMOS transistor M224 to pull the complementary output low, overpowering small inverter M226. This combination of events quickly establishes the output node at the high reference potential and the complementary output node at ground.

If, instead, a negative (active) pulse had been supplied by node 208, PMOS transistor M221 would have been turned on to pull node 221 high, turning on NMOS transistor M222 to pull the output line low. In this case, transistor M225 pulls the complementary output high. Thus, the output line is pulled high as a result of the negative (active) pulse on node 207 and low as a result of the negative (active) pulse on node 208, thereby reflecting the contents of the memory cell coupled to the bit lines 203 and 204. In the absence of pulses, caused by new transitions of the clock input, inverters M226 and M227 indefinitely hold the last read data on the output line and complementary output line. Relatively small transistors are employed in these inverters so that they may be easily overcome by contrary signals on the output lines. Note that the input levels were converted to active pulses (FIG. 1) which propagated through the entire circuit as pulses. Now at the output these pulses are again converted (if desired) to DC levels rather than pulses.

The negative pulse on either node 207 or node 208 is conveniently reset high (inactive) by PMOS transistors M211 or M212. Inverters M230-M233 are coupled from node 223 back to node 223 to reset it low (inactive) after each pulse. In the manner described above a positive pulse on node 223, four inverter delays later, turns on a positive pulse on transistor M228 to pull node 223 back to its original inactive state. Similarly, a negative pulse on node 208 causes a positive pulse on node 221 which is terminated four delays later by a positive pulse on the gate of M229. One delay before node 223 or node 221 is reset low, node 207 or node 208 is reset high by transistor M211 or M212, respectively. Again, the power-up/hold transistors for nodes 223 and 221 are not shown.

FIG. 9 is a timing diagram illustrating the timing of the signals for the example above describing the operation in FIG. 8. The word line goes high beginning at approximately 2.3 nanoseconds. Node 209 discharges slightly more rapidly than node 210. The lower potential of node 203 with respect to node 204 causes transistor M207 to pull node 205 to ground, while node 206, after initially falling, is pulled back high by PMOS transistor M215 and the low potential of node 205. The resulting low pulse on line 207 is shown, while line 208 remains almost continuously at 5 volts.

Not shown in FIG. 8 are transistors to force data onto the bit lines during a write cycle or to recover the bit lines between cycles. All of this circuitry can use the same pulse logic circuitry described herein.

Each time a pulse is generated from positive transition on node 5 (FIG. 1), data in the form of active pulses ripples through the input buffers, the decoders, turns on the selected word line, activates the sense amplifier, and updates the information stored on the true and complement output lines. And at most logic stages along the way, an active pulse causes its own reset pulse four (any even number) delays later. And after the reset pulse terminates (four delays after it starts), the logic node is ready to receive a new active pulse. Thus, after an active pulse followed by a reset pulse, any node is ready to accept a new active pulse. Thus, if there are 20 total logic delays from input to output, a second memory cycle can begin when the data representing the first cycle is about half way from input to output. Thus, the circuit can have a cycle time twice as fast as its access time.

Although a preferred embodiment of the invention has been described above with reference to the operation of a specific series of RAM circuits, it should be appreciated that the invention is not so limited and may be employed in many different types of CMOS circuits. The scope of the invention is set forth in the appended claims.

I claim:

1. A circuit comprising:
   a plurality of cascaded stages, each stage being capable of being placed in one of a set state or a reset state,
   wherein the set state of a particular stage is established by using a majority of charge supplied from an immediately preceding stage, and the reset state of the particular stage is established by using a minority of charge supplied directly from a subsequent stage.

2. A circuit as in claim 1 wherein each stage comprises at least one PMOS transistor and at least one NMOS transistor.

3. A circuit as in claim 2 wherein each stage further comprises an additional transistor.

4. A circuit as in claim 3 wherein the additional transistor is coupled to the subsequent stage to enable reset of the particular stage.

5. A circuit as in claim 2 wherein the PMOS and NMOS transistors are interconnected to form an inverter.

6. A circuit as in claim 5 wherein the PMOS and NMOS transistors include gates commonly connected.

7. A circuit as in claim 1 wherein the circuit is coupled between a first and a second potential source, and a selected number of the stages each comprises:
   an input node;
   an output node;
   a first transistor connected to the input node, the output node, and to one of the first and second potential sources of connecting the output node to one of the first and second potential sources in response to a first type signal on the input node; and
   a second transistor connected to the output node, to the other of the first and second potential sources, and to the following stage, for connecting the output node to the other of the first and second potential sources in delayed response to the earlier first type signal on the input node.

8. A circuit as in claim 7 wherein for each of the selected number of stages:
   the first transistor has a gate connected to the input node, a source connected to the second potential source, and a drain connected to the output node; and
   the second transistor has a gate connected to an output node of the following stage, a drain connected to the output node, and a source connected to the first potential source.

9. A circuit as in claim 8 wherein for each of the selected number of stages:
   the first transistor comprises an NMOS transistor; and
   the second transistor comprises a PMOS transistor.

10. A circuit as in claim 9 wherein for each of the selected number of stages, each stage further comprises:
    a third transistor connected to the output node, to the other of the first and second potential sources and to the input node, for connecting the output node to the other of the first and second potential in response to a second type signal on the input node.

11. A circuit as in claim 10 wherein for each of the selected number of stages, each stage further comprises:
    the third transistor has a source connected to the other of the first and second potential sources, a drain connected to the output node, and a gate connected to the input node.

12. A circuit as in claim 1 wherein the input node of the particular stage is connected to the output node of the stage immediately preceding the particular stage.

13. A circuit as in claim 12 wherein the subsequent stage is an even number of stages after the particular stage.

14. A CMOS circuit comprising:
    a plurality of serially-connected stages, each stage including an NMOS and a PMOS transistor;
    odd-numbered stages including an NMOS transistor which is more than one-half the size of the PMOS transistor in that stage; and
    even-numbered stages including a PMOS transistor which is more than twice the size of the NMOS transistor in that stage.

15. A CMOS circuit as in claim 14 wherein:
    each stage includes an input node and an output node, the input node of a stage being connected to the output node of a preceding stage;
    wherein the input node of an odd-numbered stage is connected to control the PMOS transistor, the input node of an even-numbered stage is connected to control the NMOS transistor; and
    wherein the NMOS transistor in an odd-numbered stage is connected to be controlled by the output node of a subsequent stage, and the PMOS transistor in an even-numbered stage is controlled by the output node of a subsequent stage.

16. A circuit as in claim 15 wherein:
    the stages are capable of being placed in a first logic stage or a second logic state;
    the NMOS transistor in the odd-numbered stages is coupled to a subsequent stage and controls the first logic state of the odd-numbered stages; and
    the PMOS transistor in the even-numbered stages is coupled to a subsequent stage and controls the first logic state of the even-numbered stages.

17. A circuit as in claim 16 wherein:
    the NMOS transistor in the even-numbered stages is coupled to a immediately preceding stage and controls the second logic state of the even-numbered stages;
    the PMOS transistor in the odd-numbered stages is coupled to an immediately preceding stage and controls the second logic stage of the odd-numbered stages.

18. A circuit as in claim 14 coupled between a lower potential and an upper potential wherein each stage comprises:
    an input node;
    an output node;
    a PMOS transistor having a gate connected to the input node, a source connected to the upper potential, and a drain connected to the output node; and
    an NMOS transistor having a gate connected to the input node, a source connected to the lower potential, and a drain connected to the output node.

19. A circuit comprising:
    a first stage;
    a plurality of cascaded stages;
    a last stage;
    each cascaded stage including set means and reset means;
    the set means for each particular one of the cascaded stages being coupled to and driven by a previous stage, and the reset means for each cascaded stage being coupled to and driven by a subsequent stage, wherein virtually all of the power available during the switching of the previous stage is available for driving the set means for the particular cascaded stage, thereby increasing the switching speed of the set means of the particular cascaded stage; and wherein a minor portion of the power available during the switching of the subsequent stage is used for driving the reset means of the particular cascaded stage, thereby accomplishing the reset of the particular cascaded stage without significantly altering the switching speed of the subsequent stage.

20. A logic circuit comprising:

a first node for receiving an input signal having energy;

a second node for supplying an output signal;

a plurality of cascaded stages each having a control input node, a reset input node, and an output node, the control input node of a first stage of the plurality being connected to the first node, the output node of a last stage of the plurality being connected to the second node;

each said stage being capable of assuming a set state and a reset state, the set state for each stage being controlled by a signal on its control input node which for all stages except the first stage is coupled to the output node of an earlier stage, whereby most of the energy available from the input signal for the first cascaded stage is used for setting that cascaded stage and most of the energy available from each subsequent stage is used for setting the next stage thereafter; and the reset state for each stage being controlled by a signal on the reset input node supplied from an output node of a subsequent stage, whereby energy to reset each particular cascaded stage comes from a subsequent stage.

21. A logic circuit as in claim 20 wherein the set state and the reset state for each cascaded stage are controlled by logic switches whose conduction depends upon the state of the control input node for that stage.

22. A circuit as in claim 21 wherein the logic switches for each cascaded stage connected between the output node of that stage and a most positive potential source comprises PMOS transistors.

23. A circuit as in claim 21 wherein the logic switches for each cascaded stage connected between the output node for that stage and a most negative potential source comprise NMOS transistors.

24. A logic circuit as in claim 20 wherein the subsequent stage is an even number of stages following the particular stage.

25. The circuit as in claim 24 wherein the even number is four.

26. A circuit for providing control signals to other circuits comprising:

a plurality of serially-connected stages, each capable of being placed in a set state or a reset state;

wherein a majority of charge to switch a stage to a set state comes from a prior stage and a majority of charge to switch a stage to a reset state comes directly from a later stage.

27. A method of increasing the speed of operation of a CMOS circuit having multiple serially-connected stages comprising:

providing a pulse having charge at an input node to a selected stage;

using a majority of the charge of the pulse to place the selected stage in an active state;

propagating the active state of the selected stage to later stages to thereby also place them in an active state; and using an output signal from one of the later stages connected directly to the selected stage to place the selected stage in a reset state to await arrival of another pulse.

* * * * *